United States Patent
Choi et al.

(10) Patent No.: US 9,082,887 B1
(45) Date of Patent: Jul. 14, 2015

(54) INTEGRATED CIRCUIT PACKAGING SYSTEM WITH POSTS AND METHOD OF MANUFACTURE THEREOF

(71) Applicants: DaeSik Choi, Seoul (KR); Taewoo Lee, Yongin-si (KR); KyuWon Lee, Ansung-Si (KR); SungWon Cho, Icheon-si (KR)

(72) Inventors: DaeSik Choi, Seoul (KR); Taewoo Lee, Yongin-si (KR); KyuWon Lee, Ansung-Si (KR); SungWon Cho, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/966,259

(22) Filed: Aug. 13, 2013

Related U.S. Application Data

(63) Continuation of application No. 12/791,865, filed on Jun. 1, 2010, now abandoned.

(51) Int. Cl.
*H01L 23/50* (2006.01)
*H01L 21/56* (2006.01)
*H01L 23/00* (2006.01)

(52) U.S. Cl.
CPC ............. *H01L 24/94* (2013.01); *H01L 24/81* (2013.01)

(58) Field of Classification Search
CPC .............. H01L 21/563; H01L 23/3128; H01L 23/49816; H01L 23/49827; H01L 23/50; H01L 2924/01322; H01L 2224/16227; H01L 2224/32225; H01L 2224/73204; H01L 2924/15311; H01L 2924/19105; H01L 2224/16225; H01L 2924/00; H01L 21/56

USPC .................................................. 438/612, 613
See application file for complete search history.

(56) References Cited

U.S. PATENT DOCUMENTS

| | | |
|---|---|---|
| 5,380,679 A | 1/1995 | Kano |
| 5,473,197 A | 12/1995 | Idaka et al. |
| 6,107,164 A | 8/2000 | Ohuchi |
| 6,208,032 B1 | 3/2001 | Yasuda et al. |
| 6,489,676 B2 | 12/2002 | Taniguchi et al. |
| 6,713,320 B2 | 3/2004 | Tong et al. |
| 6,890,795 B1 | 5/2005 | Wong et al. |
| 7,105,424 B2 | 9/2006 | Tsai et al. |
| 7,345,361 B2 | 3/2008 | Mallik et al. |
| 7,476,564 B2 | 1/2009 | Chen et al. |
| 8,390,108 B2 | 3/2013 | Cho et al. |
| 2001/0038151 A1 | 11/2001 | Takahashi et al. |
| 2001/0040289 A1 | 11/2001 | Kobayashi |
| 2003/0062623 A1 | 4/2003 | Ono et al. |
| 2003/0080422 A1 | 5/2003 | Ohara |
| 2008/0023805 A1 | 1/2008 | Howard et al. |
| 2008/0217792 A1 | 9/2008 | Onodera et al. |
| 2008/0230887 A1 | 9/2008 | Sun et al. |
| 2009/0315170 A1 | 12/2009 | Shim et al. |
| 2010/0244212 A1 | 9/2010 | Ha et al. |
| 2011/0037145 A1 | 2/2011 | Lee et al. |
| 2011/0042798 A1* | 2/2011 | Pagaila et al. ................. 257/692 |

\* cited by examiner

*Primary Examiner* — Asok K Sarkar
*Assistant Examiner* — Dmitriy Yemelyanov

(57) ABSTRACT

A method of manufacture of an integrated circuit packaging system includes: providing a semiconductor wafer having a chip pad; attaching a wafer frame to the semiconductor wafer, the wafer frame having a horizontal cover integral to a protruding connector with the protruding connector on the chip pad; forming an underfill around the protruding connector and between the horizontal cover and the semiconductor wafer; removing the horizontal cover exposing the underfill and the protruding connector; and singulating an integrated circuit package from the semiconductor wafer.

20 Claims, 12 Drawing Sheets

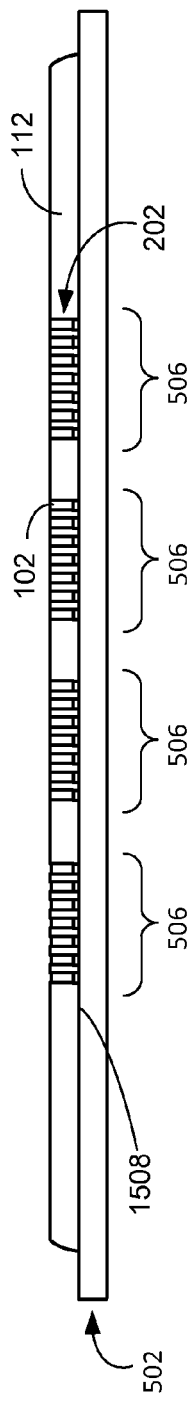
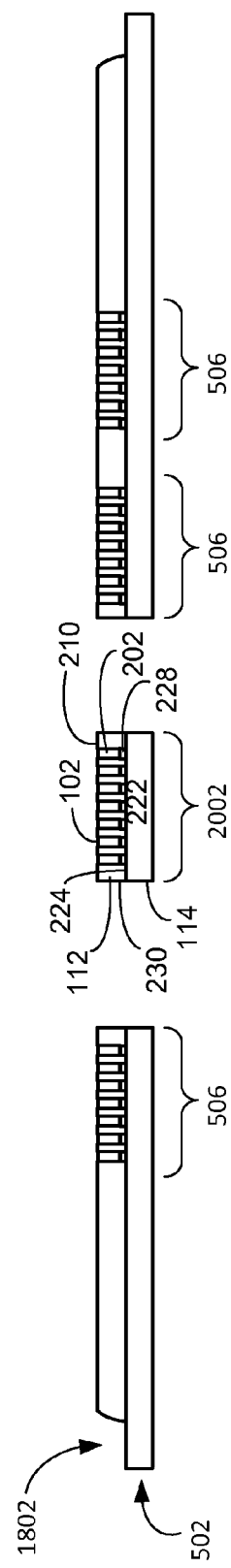

US 9,082,887 B1

INTEGRATED CIRCUIT PACKAGING SYSTEM WITH POSTS AND METHOD OF MANUFACTURE THEREOF

CROSS-REFERENCE TO RELATED APPLICATION(S)

This is a continuation of co-pending U.S. patent application Ser. No. 12/791,865 filed Jun. 1, 2010.

TECHNICAL FIELD

The present invention relates generally to an integrated circuit packaging system, and more particularly to a system with interconnects.

BACKGROUND ART

Products must be capable of competing in world markets and attracting many consumers or buyers. It is very important for products to continue to improve in features, performance, and reliability while reducing product costs, product size, and to be available quickly for purchase by the consumers or buyers.

Market growth for high density and high output/input integrated circuit packages has resulted in a trend for electronic products that are lightweight, smaller in size, multi-functional, and capable of ever increasing higher speeds. Electronic products such as cell phone base products, global positioning systems (GPS), satellites, communication equipment, consumer products, and a vast line of other similar products are in ever increasing global demand.

Smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a semiconductor wafer having a chip pad; attaching a wafer frame to the semiconductor wafer, the wafer frame having a horizontal cover integral to a protruding connector with the protruding connector on the chip pad; forming an underfill around the protruding connector and between the horizontal cover and the semiconductor wafer; removing the horizontal cover exposing the underfill and the protruding connector; and singulating an integrated circuit package from the semiconductor wafer.

The present invention provides an integrated circuit packaging system, including: an integrated circuit chip having a chip pad; a conductive post on the chip pad; and an underfill around the conductive post, the conductive post exposed from the underfill, and a non-horizontal underfill side of the underfill planar with a non-horizontal side of the integrated circuit chip.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 19 is the structure of FIG. 18 in an etching phase.

FIG. 20 is the structure of FIG. 19 in a singulation phase.

BEST MODE FOR CARRYING OUT THE INVENTION

Figure 1:
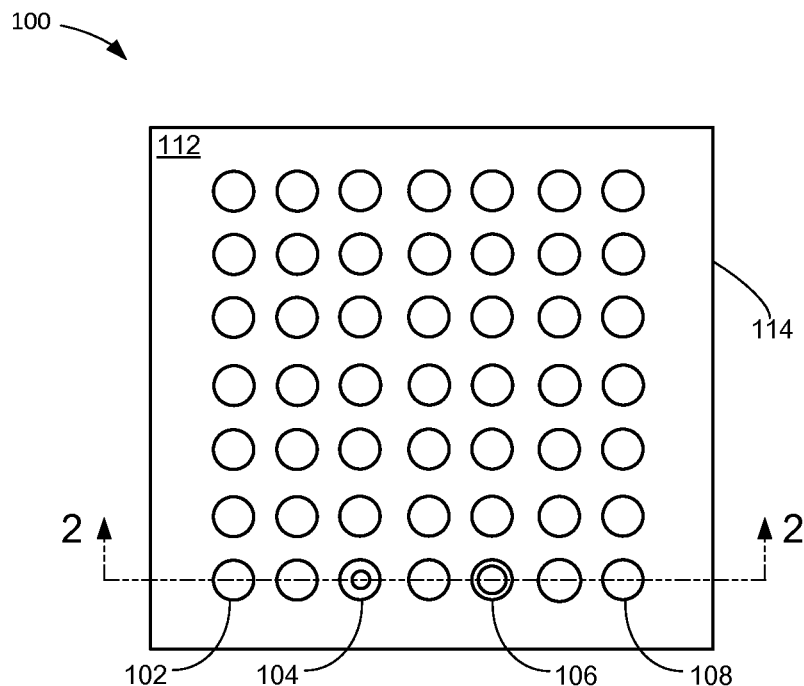
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGS. Similarly, although the views in the drawings shown for ease of description and generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

With a growing demand for flip chip packages, a critical need exists for producing high volume, reliable, and low cost flip chip packages. Embodiments of the present invention provides methods/solutions to meet the critical for the demand by providing methods to form interconnects and underfill on wafers during wafer level processing. The embodiments forthcoming describe methods that result in improved interconnect joint strengths, improved coplanar interconnects, underfill uniformity, and fine pitch interconnects for the flip chip packages.

Referring now to FIG. 1, therein is shown a bottom view of an integrated circuit packaging system 100 in a first embodiment of the present invention. The bottom view depicts first post ends 102, second post ends 104, third post ends 106, and fourth post ends 108 exposed from an underfill 112 of the integrated circuit packaging system 100. The integrated circuit packaging system 100 can be a flip chip, as an example.

The integrated circuit packaging system 100 can be formed having one of or any combination of the first post ends 102, the second post ends 104, the third post ends 106, or the fourth post ends 108 exposed in any position from the underfill 112. The integrated circuit packaging system 100 is shown having every row occupied with the first post ends 102 except the bottom row, as an example. The first post ends 102, the second post ends 104, the third post ends 106, and the fourth post ends 108 exposed from the underfill 112 can provide electrical connectivity to circuitry within the integrated circuit packaging system 100.

The underfill 112 provides a hermetic seal protection around the first post ends 102, the second post ends 104, the third post ends 106, and the fourth post ends 108 and to the contents of the integrated circuit packaging system 100. The underfill 112 also provides mechanical support and electrical isolation for the first post ends 102, the second post ends 104, the third post ends 106, and the fourth post ends 108. The underfill 112 can be formed from an etchant resistant electrically insulative material capable of providing structural rigidity and characteristics similar that of an epoxy, an encapsulant, or an anisotropic conductive film (ACF).

The underfill 112 can be used to improve the thermal dissipation characteristics of the present invention. As an example, the underfill 112 can be formed from a thermally conductive material to provide both improve thermal dissipation and the hermetic seal protection. Non-horizontal underfill sides 114 of the underfill 112 enclose an area containing the first post ends 102, the second post ends 104, the third post ends 106, and the fourth post ends 108 forming an outline of a planar shape of the integrated circuit packaging system 100.

For illustrative purposes, the first post ends 102, the second post ends 104, the third post ends 106, and the fourth post ends 108 are shown having a footprint shape of a circle. It is understood that the first post ends 102, the second post ends 104, the third post ends 106, and the fourth post ends 108 can have a different footprint shapes. For example, the first post ends 102 can have combination of footprint shapes that can include a rectangle, oval, or a multifaceted geometric shape.

Figure 2:
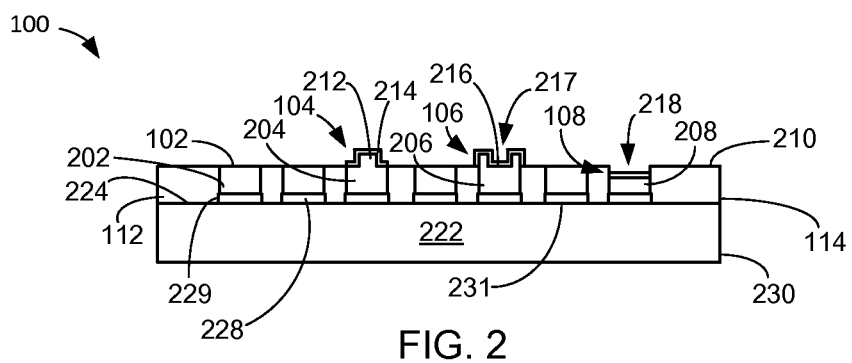
FIG. 2 is a cross-sectional view of FIG. 1 taken along a line 2-2 of FIG. 1.

Referring now to FIG. 2, therein is shown a cross-sectional view of FIG. 1 taken along a line 2-2 of FIG. 1. The cross-sectional view depicts first conductive posts 202 having the first post ends 102, second conductive posts 204 having the second post ends 104, third conductive posts 206 having the third post ends 106, and the fourth conductive posts 208 having the fourth post ends 108.

The first post ends 102, the second post ends 104, the third post ends 106, and the fourth post ends 108 are exposed from an attachment side 210 of the underfill 112. The first post ends 102, the second post ends 104, the third post ends 106, and the fourth post ends 108 can be formed from a metal that can include a copper metal, a conductive metal, a conductive metal alloy, or any combination thereof.

The first post ends 102 can be formed coplanar to the attachment side 210 using a planarization process, an etching process, or a combination thereof. The planarization process results in the first post ends 102 having planarization marks and the etching process results in etch marks.

The planarization marks are defined as a physical appearance on a surface of an element that is a result of manufacturing processes that can include grinding, sanding, polishing, or any combination thereof. The planarization marks are accompanied by differences between a grain structure on the surface of the element and a grain structure below the surface of the element.

The etch marks are defined as an etched physical appearance on a surface of an element that is the result of a chemical etchant. The chemical etchant is an acidic, alkali, or basic chemical used to dissolve unwanted materials such as metals, semiconductor materials, or glass from a reduction-oxidation (redox) reaction.

The etched physical appearance are from changes in microstructure and macrostructure of the surface of the element as a result of the redox reactions introduced by the chemical etchant are observable using metallography techniques to observe characteristics that can include a surface crystal structure, surface reflective, surface refractive, and surface profile characteristics.

The second conductive posts 204 includes a raised platform 212 located centrally on the second post ends 104. The second post ends 104 can optionally include a protect layer 214.

The protect layer 214 can be formed from a conductive metal different from the metal of the first post ends 102, the second post ends 104, the third post ends 106, and the fourth post ends 108. The protect layer 214 can cover a portion of the second conductive posts 204 over the attachment side 210 to prevent the portion of the second conductive posts 204 from exposure to the chemical etchant.

The protect layer 214 on the second post ends 104 includes etch marks as a result of the etching process. The second post ends 104 can be formed without the protect layer 214 provided the second post ends 104 are formed from an etchant resistant conductive metal material. The second post ends 104 formed without the protect layer 214 results in the second post ends 104 having the etch marks.

The third post ends 106 can project above the attachment side 210 and include a cavity 216 centrally located in the third post ends 106. The cavity 216 is formed by surrounding sides and an inner post base 217 of the third post ends 106 that are coplanar with the attachment side 210.

The third post ends 106 can optionally include the protect layer 214. The protect layer 214 can cover a portion of the third conductive posts 206 and the cavity 216 over the attachment side 210 to prevent the portion of the third conductive posts 206 from exposure to the chemical etchant.

The protect layer 214 on the third post ends 106 includes etch marks as a result of the etching process. The third post ends 106 can be formed without the protect layer 214 provided the third post ends 106 are formed from an etchant resistant conductive metal material. The third post ends 106 formed without the protect layer 214 results in the third post ends 106 having the etch marks.

The fourth post ends 108 of the fourth conductive posts 208 can be below the attachment side 210 and forms a bottom of a recess 218 of the underfill 112. The fourth post ends 108 can optionally include the protect layer 214 covering the fourth conductive posts 208. The protect layer 214 can cover a portion of the fourth conductive posts 208 to prevent the portion of the fourth conductive posts 208 from exposure to the chemical etchant.

The protect layer 214 on the fourth post ends 108 includes etch marks as a result of the etching process. The fourth post ends 108 can be formed without the protect layer 214 provided the fourth post ends 108 are formed from an etchant resistant conductive metal material. The fourth post ends 108 formed without the protect layer 214 results in the fourth post ends 108 having the etch marks.

The underfill 112 is attached to an integrated circuit chip 222. The integrated circuit chip 222 is defined as an active device including a non-active side and an active side 224 having circuitry fabricated thereon. A side of the underfill 112 opposite the attachment side 210 is in direct contact with the active side 224 of the integrated circuit chip 222.

The attachment side 210 can be parallel with the active side 224. Chip pads 228 formed of conductive metal or metal alloys on the active side 224. The chip pads 228 are bond pads for the integrated circuit chip 222. The chip pads 228 include a lateral sidewall 229, which is exposed from the active side 224 of the integrated circuit chip 222. The chip pads 228 are attached to ends of the first conductive posts 202 opposite the first post ends 102, the second conductive posts 204 opposite the second post ends 104, the third conductive posts 206 opposite the third post ends 106, and the fourth conductive posts 208 opposite the fourth post ends 108 using solder. A top side 231 of each of the chip pads 228 is in direct physical contact with the active side 224 of the integrated circuit chip 222. The chip pads 228 provide connectivity between circuitry of the integrated circuit chip 222 and the first conductive posts 202, the second conductive posts 204, the third conductive posts 206, and the fourth conductive posts 208.

The first conductive posts 202, the second conductive posts 204, the third conductive posts 206, and the fourth conductive posts 208 are formed from a material that can include a copper metal, a conductive metal, a conductive metal alloy, or any combination thereof. The first conductive posts 202, the second conductive posts 204, the third conductive posts 206, and the fourth conductive posts 208 can be structured having multiple joined layers of different material having different physical characteristic properties.

The underfill 112 surrounds, provides structural support, and hermetically seals the active side 224, sides of the chip pads 228, and sides of the first conductive posts 202, the second conductive posts 204, the third conductive posts 206, and the fourth conductive posts 208. Non-horizontal sides 230 of the integrated circuit chip 222 can be coplanar with the non-horizontal underfill sides 114.

The attachment side 210 can also be formed using a planarization process, an etching process, or a combination thereof. The attachment side 210 can exhibit characteristics of similar to the planarization marks and the etch marks of the first post ends 102.

It has been discovered that the present invention provides the integrated circuit packaging system 100 with superior reliability over solder bumped packaging systems. The underfill 112 provides improved joint strength from lateral and tangential forces applied to the first conductive posts 202, the second conductive posts 204, the third conductive posts 206, and the fourth conductive posts 208 when integrating with a next level of integration (not shown) such as a printed circuit board or an integrated circuit packaging assembly. The improved joint strength is a result of the active side 224, sides of the chip pads 228, and the first conductive posts 202, the second conductive posts 204, the third conductive posts 206, and the fourth conductive posts 208 held together by the underfill 112. Unlike solder bumps, the first post ends 102 are formed to be coplanar with one another resulting in improved connectivity with the next level of integration. The combination of the improved joint strength and the improved connectivity results in the superior reliability of the integrated circuit packaging system 100 over the solder bumped packaging systems.

It has also been discovered that the present invention provides the integrated circuit packaging system 100 with increased interconnection density capabilities. The underfill 112 provides additional support enabling the first conductive posts 202, the second conductive posts 204, the third conductive posts 206, and the fourth conductive posts 208 to be thinner and closer together than solder bumps resulting in the increased interconnection density capabilities.

Figure 3:
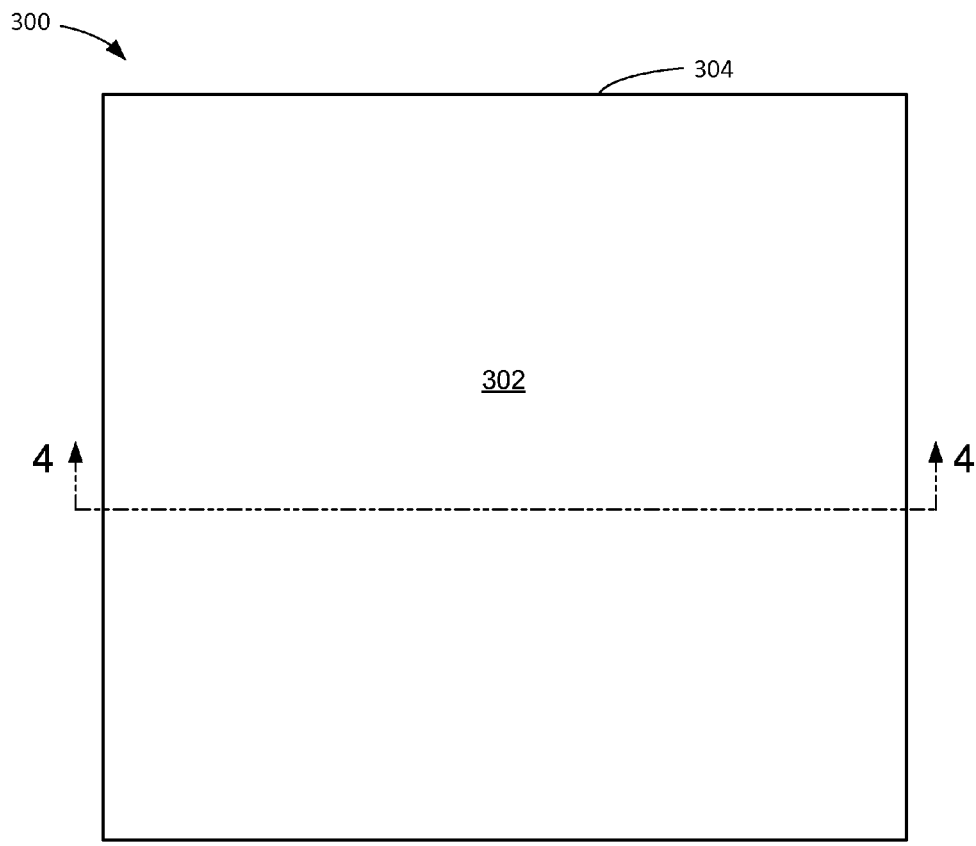
FIG. 3 is a top view of an integrated circuit packaging system in a second embodiment of the present invention.

Referring now to FIG. 3, therein is shown a top view of an integrated circuit packaging system 300 in a second embodiment of the present invention. The top view depicts an encapsulation 302 having a rectangular shape and package sides 304 formed around a periphery of the integrated circuit packaging system 300. The encapsulation 302 can optionally be omitted from the integrated circuit packaging system 300.

The encapsulation 302 can be formed form materials that can include an epoxy, a ceramic, a plastic, a molding compound, or any combination thereof. The encapsulation 302 can be used to protect the integrated circuit packaging system 300 by providing structural support, and hermetically sealing the contents of the integrated circuit packaging system 300.

Figure 4:
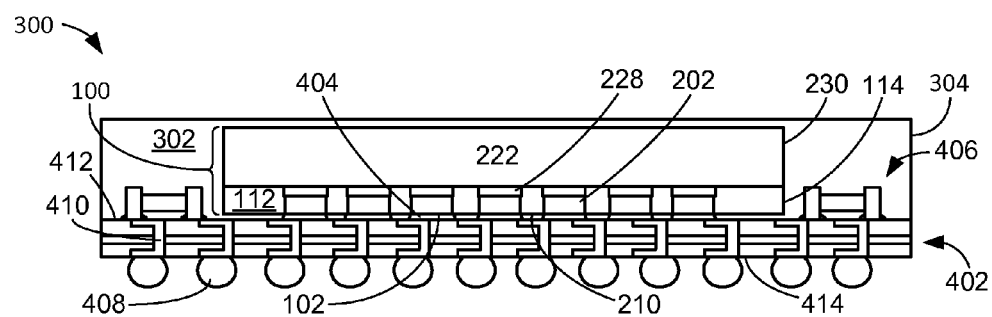
FIG. 4 is a cross-sectional view of FIG. 3 taken along a line 4-4 of FIG. 3.

Referring now to FIG. 4, therein is shown a cross-sectional view of FIG. 3 taken along a line 4-4 of FIG. 3. The integrated circuit packaging system 300 can include the integrated circuit packaging system 100, a base substrate 402, chip interconnects 404, discrete components 406, the encapsulation 302, and system connectors 408.

For purposes of illustration, the cross-sectional view taken along the line 4-4 is shown intersecting the first conductive posts 202 having the first post ends 102. The second conductive posts 204 of FIG. 2, the third conductive posts 206 of FIG. 2, and the fourth conductive posts 208 of FIG. 3 are not shown or included here.

The base substrate 402 can include a substrate, an interposer, a circuit board, or a laminate having base conductors 410 on an inner base side 412, on an outer base side 414 opposite the inner base side 412, and within the base substrate 402. The base conductors 410 can be formed from a conductive material and provide connectivity between, on, and within the inner base side 412 and the outer base side 414.

The integrated circuit packaging system 100 can be mounted over and connected to the inner base side 412 using the chip interconnects 404. The chip interconnects 404 attach the first post ends 102 with the base conductors 410 and provide electrical connectivity between the first post ends 102 and the base conductors 410 of the base substrate 402.

The chip interconnects 404 can be formed of solder and include solder on pads, solder films, solder pastes, or any combination thereof. The chip interconnects 404 are oriented between the attachment side 210 and the inner base side 412.

The discrete components 406 can be mounted and connected to the inner base side 412 adjacent the integrated circuit packaging system 100. Any one of the discrete components 406 is defined to be either a transistor, a resistor, a capacitor, a diode, or an inductor.

The encapsulation 302 can cover the integrated circuit packaging system 100, the discrete components 406, and the inner base side 412 to provide additional protection. The package sides 304 can be parallel to the non-horizontal sides 230 and the non-horizontal underfill sides 114 of the underfill 112. The encapsulation 302 can be omitted and the integrated circuit packaging system 300 can be protected by an enclosure (not shown) such as a cabinet, a room, a chamber, or embedded in a package subsystem.

The system connectors 408 can be optionally attached to the base conductors 410 on the outer base side 414. The system connectors 408 can include bond wires, conductive balls, conductive bumps, conductive leads, or a combination thereof.

The system connectors 408 can provide connectivity between the integrated circuit packaging system 300 and the next level of integration. The system connectors 408 can be omitted to enable other means of connectivity between the next level of integration and the integrated circuit packaging system 300.

It has been discovered that the present invention provides the integrated circuit packaging system 300 with a package profile height lower than a package profile height of solder bumped packaging systems. The first post ends 102 of the integrated circuit packaging system 100 can be attached to the inner base side 412 of the base substrate 402 using a thin solder film. A combination of the first post ends 102 coplanar with the attachment side 210 and the thin solder film results in the package profile height of the present invention to be lower than the package profile height of the solder bumped packaging systems.

Figure 5:
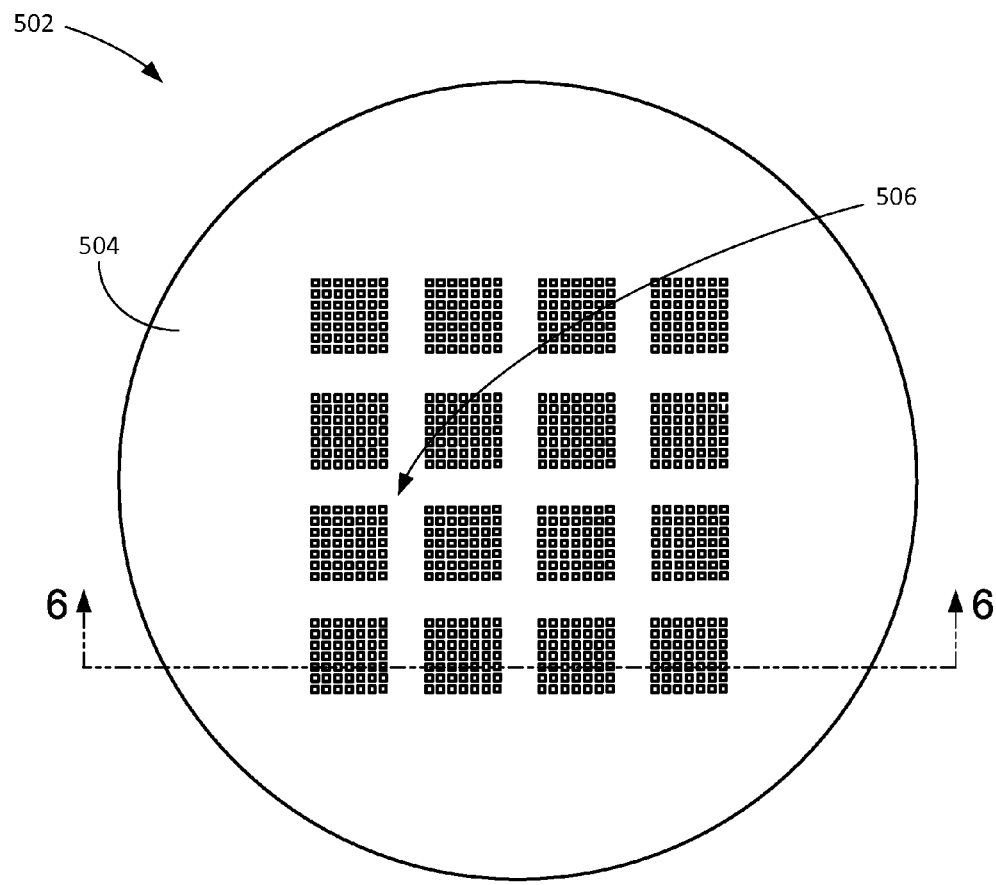
FIG. 5 is a top view of a semiconductor wafer used in manufacturing of the integrated circuit packaging system of FIG. 2.

Referring now to FIG. 5, therein is shown a top view of a semiconductor wafer 502 used in manufacturing of the integrated circuit packaging system 100 of FIG. 2. The top view of the semiconductor wafer 502 is shown having a shape of an ellipse. The semiconductor wafer 502 is defined as a thin slice of semiconductor material used as a substrate from which miniaturized electronic circuitry is built in and over a semiconductor active side 504 of the semiconductor wafer 502.

Chip sites 506 are shown located on the semiconductor wafer 502. The chip sites 506 are areas of the semiconductor wafer 502 having active circuitry along the semiconductor active side 504. Each of the chip sites 506 can be used to form and build the miniaturized semiconductor circuitry of the integrated circuit chip 222 of FIG. 2. For illustrative purposes, the semiconductor wafer 502 is depicted with sixteen of the chip sites 506. The semiconductor wafer 502 can have any number of the chip sites 506. The semiconductor wafer 502 can have fifty-two of the chip sites 506, as an example.

Figure 6:
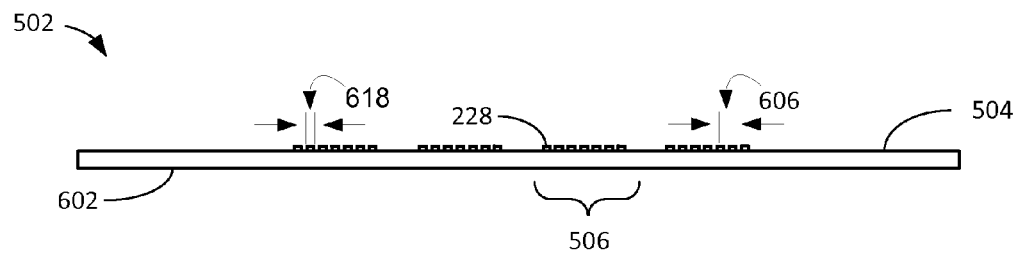
FIG. 6 is a cross-sectional view of FIG. 5 taken along a line 6-6 of FIG. 5.

Referring now to FIG. 6, therein is shown a cross-sectional view of FIG. 5 taken along a line 6-6 of FIG. 5. The cross-sectional view shows a wafer non-active side 602 of the semiconductor wafer 502 opposite the semiconductor active side 504.

Each of the chip sites 506 include the chip pads 228 exposed from the semiconductor active side 504. The chip pads 228 can provide connectivity to the miniaturized semiconductor circuitry within each of the chip sites 506.

The chip pads 228 can include a chip pad pitch 606 and a maximum wafer pad width 618. The chip pad pitch 606 is defined as the distance between centers at adjacent locations of the chip pads 228 within each of the chip sites 506. The chip pad pitch 606 of the chip pads 228 within each of the chip sites 506 can be identical.

The maximum wafer pad width 618 is defined a largest of all possible distances measurable from any first peripheral edge of one of the chip pads 228 to a second peripheral edge of the one of the chip pads 228 opposite the first peripheral edge.

Figure 7:
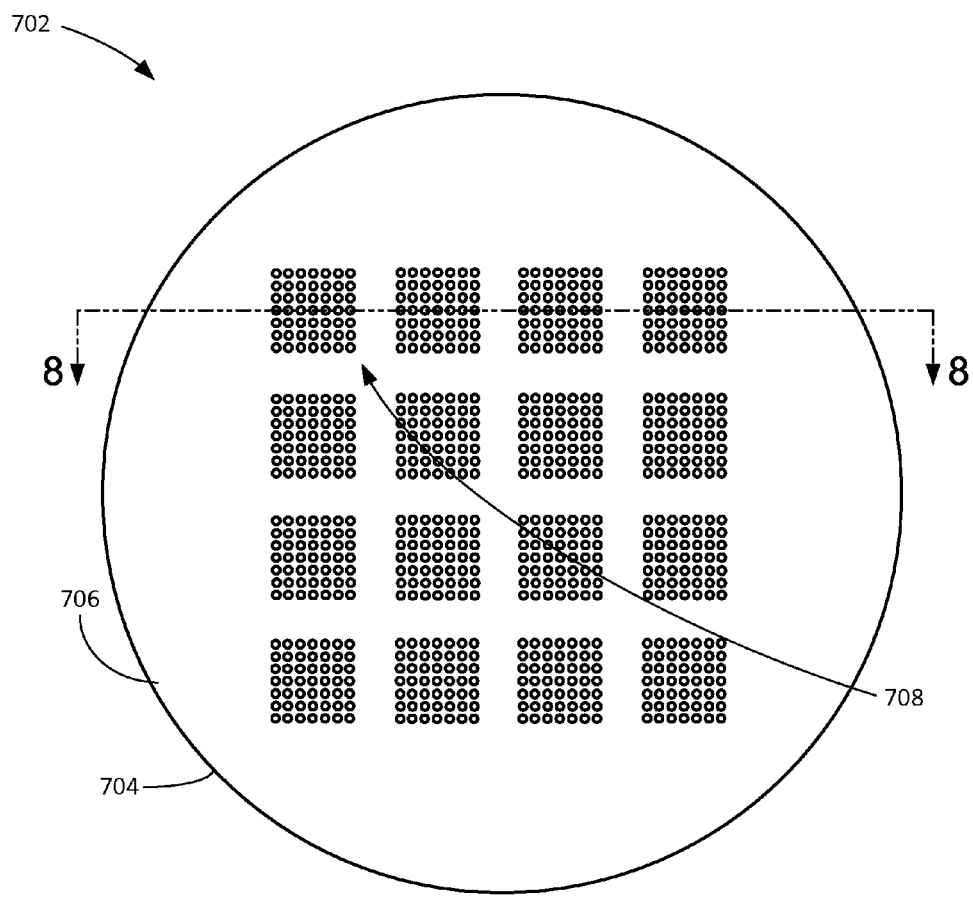
FIG. 7 is a bottom view of a wafer frame used in manufacturing of the integrated circuit packaging system of FIG. 2.

Referring now to FIG. 7, therein is shown a bottom view of a wafer frame 702 used in manufacturing of the integrated circuit packaging system 100 of FIG. 2. The wafer frame 702 includes a horizontal cover 704 with a connection side 706.

A perimeter area formed by the horizontal cover 704 can be less than a perimeter area formed by the semiconductor wafer 502 of FIG. 5. The horizontal cover 704 is formed from a material that can be removed using processes that can include grinding, sanding, polishing, cutting, sawing, or any combination thereof.

The material used to form the horizontal cover 704 can be a metal that includes copper, copper alloys, or any combination thereof. The bottom view of the wafer frame 702 is shown having connect sites 708. The connect sites 708 are areas on the connection side 706.

Figure 8:
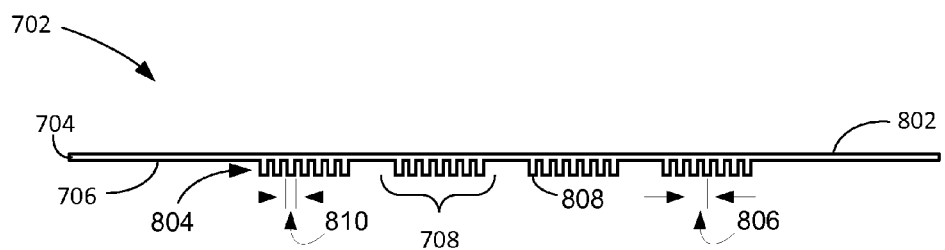
FIG. 8 is a cross-sectional view of FIG. 7 taken along a line 8-8 of FIG. 7.

Referring now to FIG. 8, therein is shown a cross-sectional view of FIG. 7 taken along a line 8-8 of FIG. 7. The cross-sectional view depicts the wafer frame 702 having the horizontal cover 704 with the connection side 706 and a non-connection side 802 opposite the connection side 706.

For illustrative purposes, the protruding connectors 804 are shown perpendicular to the connection side 706. The protruding connectors 804 can be oriented having any angle relative to the connection side 706. The protruding connectors 804 can be oriented having an angle of ninety degrees with respect to the connection side 706, as an example.

The protruding connectors 804 can be formed from a material identical to the conductive metal of the first conductive posts 202 of FIG. 2 and integral to the connection side 706. The protruding connectors 804 within each of the connect sites 708 can have a connector pitch 806 less than three hundred microns inclusive.

The connector pitch 806 is defined as the distance between centers at adjacent locations of the protruding connectors 804 within each of the connect sites 708. The connector pitch 806 of the protruding connectors 804 within each of the connect sites 708 can be identical.

Attachment surfaces 808 can be formed on an end of each of the protruding connectors 804 and can be facing away from the connection side 706. The attachment surfaces 808 can be formed from a material similar to the material of the protruding connectors 804 and parallel with the connection side 706.

The attachment surfaces 808 can have a maximum body width 810 less than one hundred fifty microns inclusive. The maximum body width 810 is defined a largest of all possible distances measurable from any peripheral edge of one of the attachment surfaces 808 to an edge of the one of the attachment surfaces 808 opposite the peripheral edge.

Figure 9:
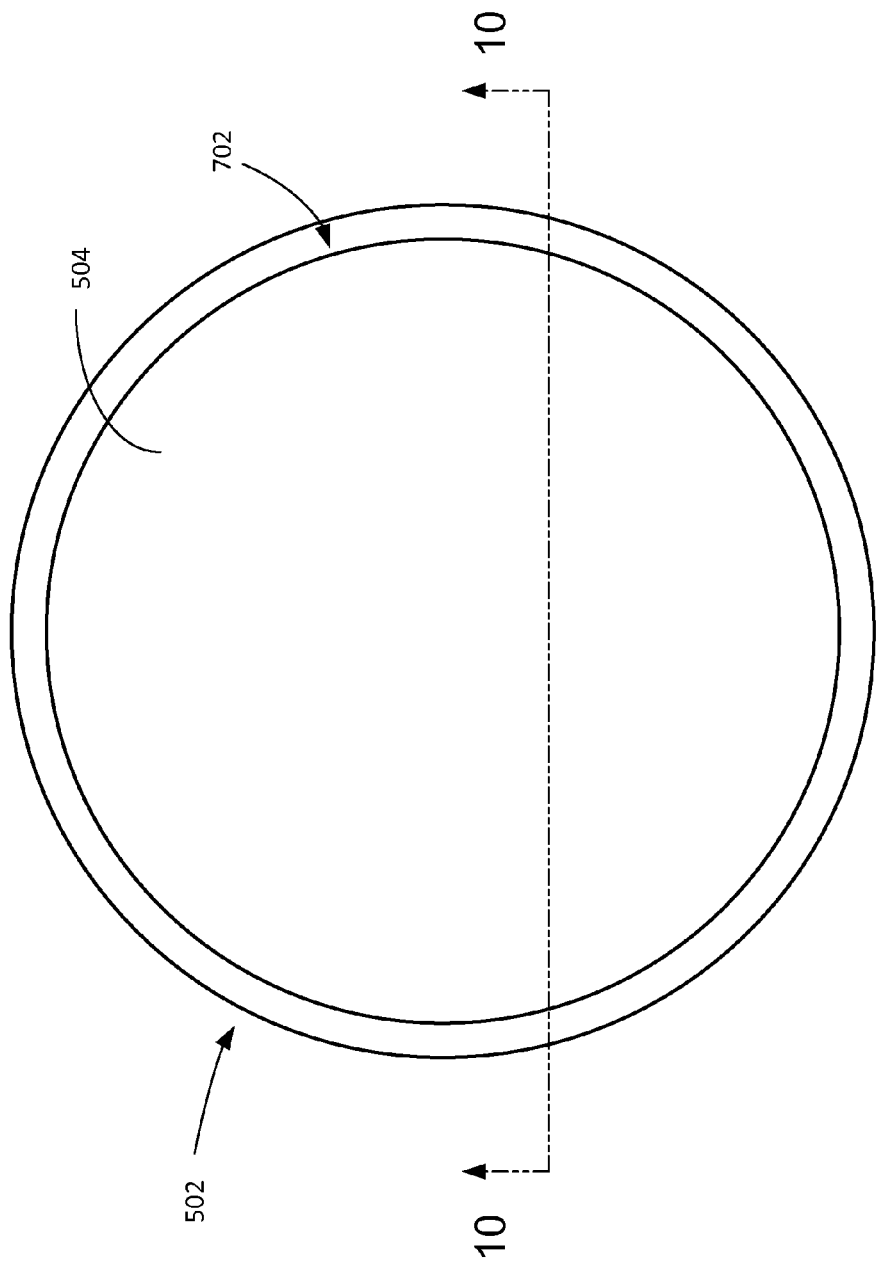
FIG. 9 is a top view of the structure of FIG. 7 on the structure of FIG. 5 in a mounting phase.

Referring now to FIG. 9, therein is shown a top view of the structure of FIG. 7 on the structure of FIG. 5 in a mounting phase. The top view depicts the wafer frame 702 of FIG. 7 mounted over the semiconductor wafer 502 having the semiconductor active side 504 exposed around a circumference of the wafer frame 702 during a mounting process. The mounting process can include mechanized fixtures (not show) that can include automated computer monitoring, alignment, and positional equipment in a clean room environment.

Figure 10:
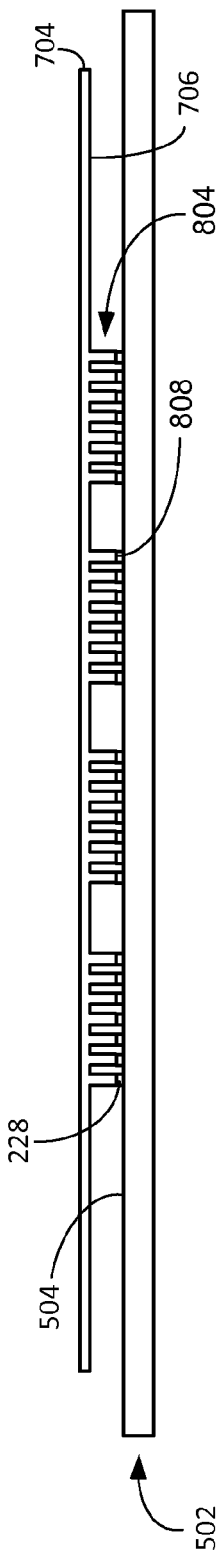
FIG. 10 is a cross-sectional view of FIG. 9 taken along a line 10-10 of FIG. 9 in an attaching phase.

Referring now to FIG. 10, therein is shown a cross-sectional view of FIG. 9 taken along a line 10-10 of FIG. 9 in an attaching phase. Each of the connect sites 708 of FIG. 7 on the connection side 706 of the horizontal cover 704 are aligned over the chip sites 506 of FIG. 5 on the semiconductor active side 504 of the semiconductor wafer 502.

The chip pads 228 of the semiconductor wafer 502 are attached to the attachment surfaces 808 of the protruding connectors 804 using a conductive bonding material during an attaching process. The conductive bonding material can include a eutectic reaction layer with thermo-compression, ultra-sonic, thermo-sonic, thermo conductive applied energy.

Figure 11:
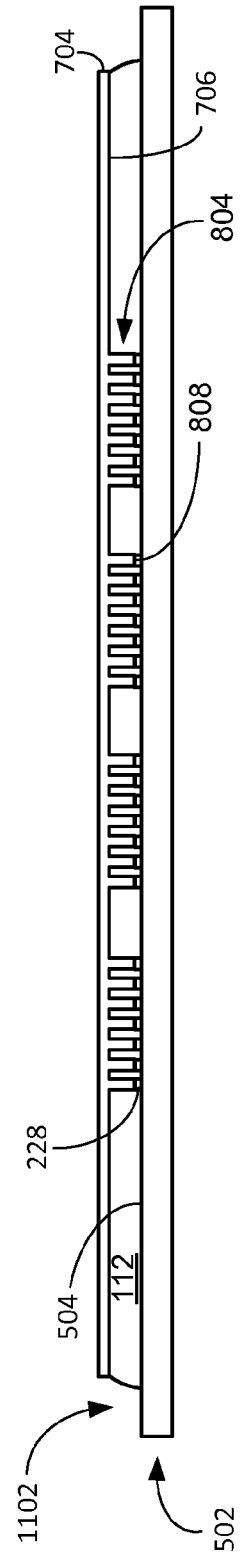
FIG. 11 is the structure of FIG. 10 in an underfill applying phase.

Referring now to FIG. 11, therein is shown the structure of FIG. 10 in an underfill applying phase. The underfill 112 is applied between the horizontal cover 704 and the semiconductor wafer 502 using a filling process that can include a combination of dispensing equipment (not shown) with contact heating, convective heating, or infrared heating.

The underfill 112 surrounds the protruding connectors 804, surrounds the chip pads 228, and covers the connection side 706 and the semiconductor active side 504. A ring shaped area 1102 around the underfill 112 can expose the semiconductor active side 504 between the underfill 112 and a perimeter outline of the semiconductor wafer 502.

It has been discovered that the present invention provides the integrated circuit packaging system 100 with improved reliability. The underfill 112 is applied during wafer processing phases of manufacturing which involves a highly specialized facility than includes cleanrooms, filtered laminated air flow, controlled temperature and humidity, and specialized equipment operating with extreme precision from the front end of the line (FEOL) through the back end of the line (BEOL). The underfill 112 having a uniform distribution covers the connection side 706, the semiconductor active side 504, the chip pads 228, the protruding connectors 804, and attachment areas between the attachment surfaces 808 and the protruding connectors 804. The uniform distribution is defined a material having the same densities, composition, and characteristics throughout the material. The uniform distribution of the underfill 112 provides results in improved reliability of the structure and circuitry of the integrated circuit packaging system 100.

Figure 12:
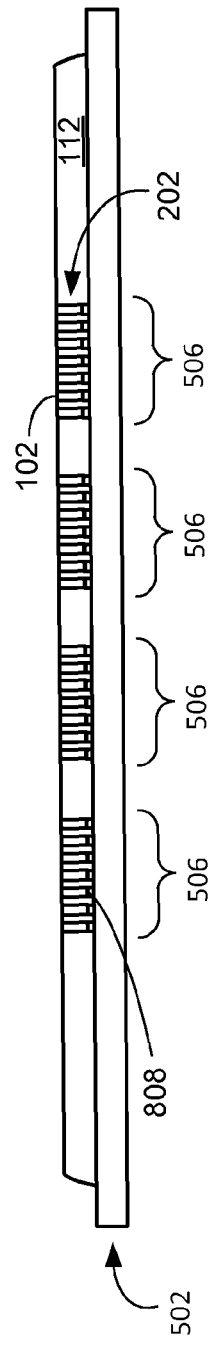
FIG. 12 is the structure of FIG. 11 in a planarizing phase.

Referring now to FIG. 12, therein is shown the structure of FIG. 11 in a planarizing phase. The horizontal cover 704 of FIG. 11 is removed from above the chip sites 506 to expose the end of each of the protruding connectors 804 of FIG. 11 opposite the end with the attachment surfaces 808 using a planarization process.

The planarization process can include grinding, sanding, polishing, cutting, sawing, or any combination thereof of the horizontal cover 704 to expose the protruding connectors 804 and the underfill 112. The planarization of the protruding connectors 804 results in formation of the first conductive posts 202 with the first post ends 102. The first post ends 102 are exposed from the underfill 112 and parallel to the semiconductor wafer 502. The first post ends 102 are formed having the planarization marks.

Figure 13:
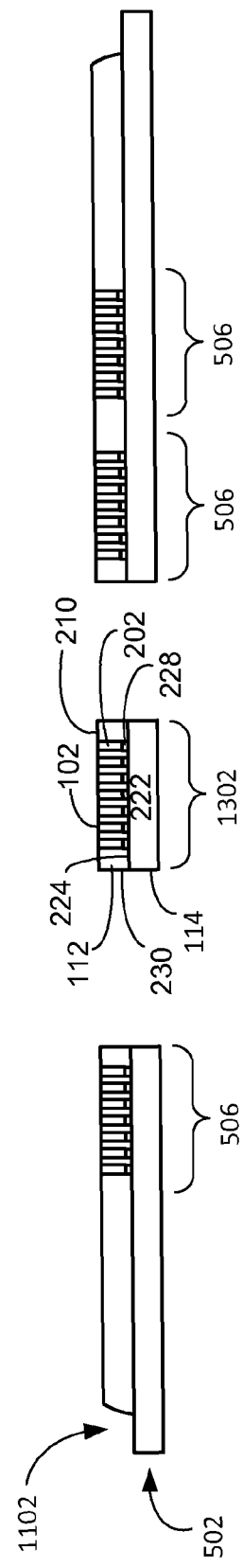
FIG. 13 is the structure of FIG. 12 in a singulation phase.

Referring now to FIG. 13, therein is shown the structure of FIG. 12 in a singulation phase. Non-horizontal planar cuts through the semiconductor wafer 502 and the underfill 112 are used to separate the chip sites 506 of FIG. 12 from one another and the ring shaped area 1102 during a singulation process. The singulation process includes cutting, sawing, grinding, or any combination thereof.

Each of the chip sites 506 isolated from the structure of FIG. 12 results in the formation of the integrated circuit packaging system 1302. The integrated circuit packaging system 1302 is similar to the integrated circuit packaging system 100 of FIG. 2 except the integrated circuit packaging system 1302 has only the first conductive posts 202 with the first post ends 102 and includes the integrated circuit chip 222, the underfill 112, and the chip pads 228. The non-horizontal underfill sides 114, the non-horizontal sides 230, and the attachment side 210 are formed during the singulation process.

Figure 14:
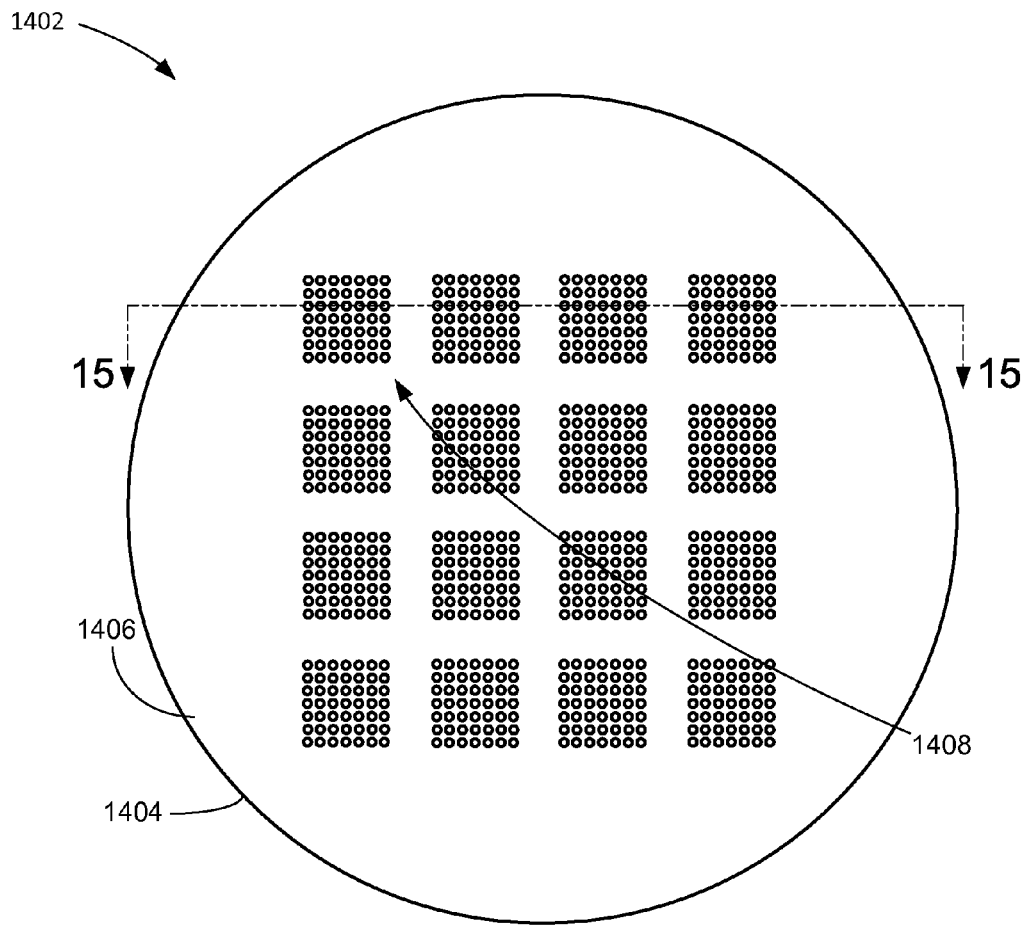
FIG. 14 is a bottom view of a wafer frame used in manufacturing of the integrated circuit packaging system of FIG. 2 in a third embodiment of the present invention.

Referring now to FIG. 14, therein is shown a bottom view of a wafer frame used in manufacturing of the integrated circuit packaging system 100 of FIG. 2 in a third embodiment of the present invention. The wafer frame 1402 includes a horizontal cover 1404 with a connection side 1406.

A perimeter area formed by the horizontal cover 1404 can be less than a perimeter area formed by the semiconductor wafer 502 of FIG. 5. The protect layer 214 of FIG. 2 can optionally be used to separate and isolate the horizontal cover 1404 from the second conductive posts 204 of FIG. 2, from the third conductive posts 206 of FIG. 2, and from the fourth conductive posts 208 of FIG. 2.

The horizontal cover 1404 formed from a material having a greater chemical etchant solubility than chemical etchant solubilities of the second conductive posts 204, the third conductive posts 206, and the fourth conductive posts 208 can omit the application of the protect layer 214. The chemical etchant solubility is defined as the ability of an element to dissolve in the chemical etchant to form a homogeneous solution.

The bottom view of the wafer frame 1402 is shown having connect sites 1408. The connect sites 1408 are areas on the connection side 1406 used to identify specific portions of the horizontal cover 1404 within, above, and below the areas on the connection side 1406.

Figure 15:
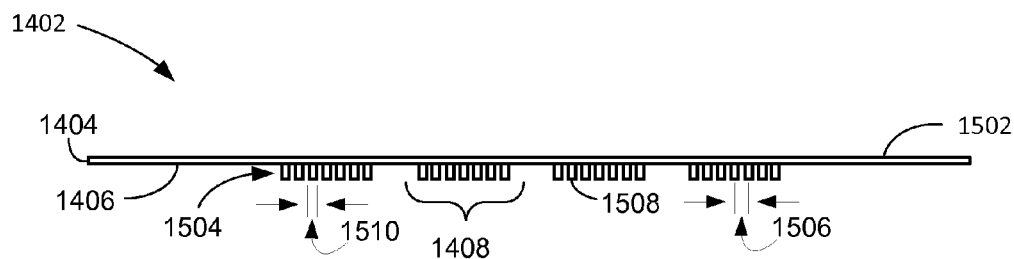
FIG. 15 is a cross-sectional view of FIG. 14 taken along a line 15-15 of FIG. 14.

Referring now to FIG. 15, therein is shown a cross-sectional view of FIG. 14 taken along a line 15-15 of FIG. 14. For purposes of illustration, the cross-sectional view taken along the line 15-15 is shown intersecting the first conductive posts 202 having the first post ends 102. The second conductive posts 204 of FIG. 2, the third conductive posts 206 of FIG. 2, and the fourth conductive posts 208 of FIG. 3 are not shown. The cross-sectional view depicts the wafer frame 1402 having the horizontal cover 1404 with the connection side 1406 and a side 1502 opposite the connection side 1406.

Each of the connect sites 1408 can include protruding connectors 1504 projecting perpendicularly from the connection side 1406. The protruding connectors 1504 can formed from a material identical to the material of the second conductive posts 204, the third conductive posts 206, and the fourth conductive posts 208 and integral to the connection side 1406 of the horizontal cover 1404.

The protruding connectors 1504 within each of the connect sites 1408 can have a connector pitch 1506 less than three hundred microns inclusive. The connector pitch 1506 is defined as the distance between centers at adjacent locations of the protruding connectors 1504 within each of the connect sites 1408. The connector pitch 1506 of the protruding connectors 1504 within each of the connect sites 1408 can be identical.

Attachment surfaces 1508 can be formed on an end of each of the protruding connectors 1504 opposite an end of the protruding connectors 1504 integral to the connection side 1406. The attachment surfaces 1508 of the second post ends 104, the third post ends 106, and the fourth post ends 108 can be formed from a material similar to the material of the protruding connectors 1504 and parallel with the connection side 1406.

The protect layer 214 of FIG. 2 can cover the ends of the protruding connectors 1504 integral to the connection side 1406 and is between the protruding connectors 1504 and the connection side 1406 of the horizontal cover 1404. In this embodiment, the protect layer 214 (not shown) is within the semi-horizontal cover. The protect layer 214 can be formed on or in the horizontal cover 1404.

For example, the protect layer 214 could optionally be omitted if the material of the protruding connectors 1504 is a chemical insoluble material. The chemical insoluble material is defined as a material capable being exposed to the chemical etchant without any loss or change to the material.

The protect layer 214 can be formed on or in the connection side 1406 of the horizontal cover 1404. The connection side 1406 can be formed having indentations molded to shapes of the second post ends 104 and the third post ends 106. The indentations in the connection side 1406 can be covered with the protect layer 214 and used to form the second conductive posts 204 and the third conductive posts 206, respectively. The connection side 1406 can also protruded portions molded to a shape of the recess 218 of FIG. 2 and covered with the protect layer 214 to form the fourth conductive posts 208.

In a further example, the protect layer 214 can be formed on the protruding connectors 1504. The protruding connectors 1504 can be formed having an end shaped identically to the second post ends 104, the third post ends 106, and the fourth post ends 108. The end shaped identically to the second post ends 104, the third post ends 106, and the fourth post ends 108 can be covered with the protect layer 214, joined to the connection side 1406 of the horizontal cover 1040 with the attachment surfaces 1508 coplanar and facing away from the connection side 1406. The protruding connectors 1504 can be used to form the second conductive posts 204, the third conductive posts 206, and the fourth conductive posts 208, respectively.

In yet a further example, the protect layer 214 can be formed as a part of the protruding connectors 1504. The protruding connectors 1504 can be formed having multiple layers of different material that can include a material identical to the material of the protect layer 214. The material layered on the protruding connectors 1504 can be formed to be identical to the second post ends 104, the third post ends 106, and the fourth post ends 108 and used to form the second conductive posts 204, the third conductive posts 206, and the fourth conductive posts 208 from the protruding connectors 1504, respectively.

The dimensions of each of the protruding connectors 1504 used to form the second conductive posts 204 of FIG. 2, the third conductive posts 206 of FIG. 2, and the fourth conductive posts 208 of FIG. 2 are identical to the second conductive posts 204, the third conductive posts 206, and the fourth conductive posts 208 respectively.

The dimensions of each of the protruding connectors 1504 having the protect layer 214 of FIG. 2 can be identical to dimensions of the second conductive posts 204 of FIG. 2, the third conductive posts 206 of FIG. 2, or the fourth conductive posts 208 of FIG. 2 with the protect layer 214. Portions of the connection side 1406 integral to the second post ends 104 of FIG. 2, the third post ends 106 of FIG. 2, and the fourth post ends 108 of FIG. 2 can extend away from or retract in the connection side 1406, thus enabling ends of all of the protruding connectors 1504 to be coplanar.

The attachment surfaces 1508 can have a maximum body width 1510 one hundred fifty microns inclusive. The maximum body width 1510 is defined a largest of all possible distances measurable from any peripheral edge of one of the attachment surfaces 1508 to an edge of the one of the attachment surfaces 1508 opposite the peripheral edge.

Figure 16:
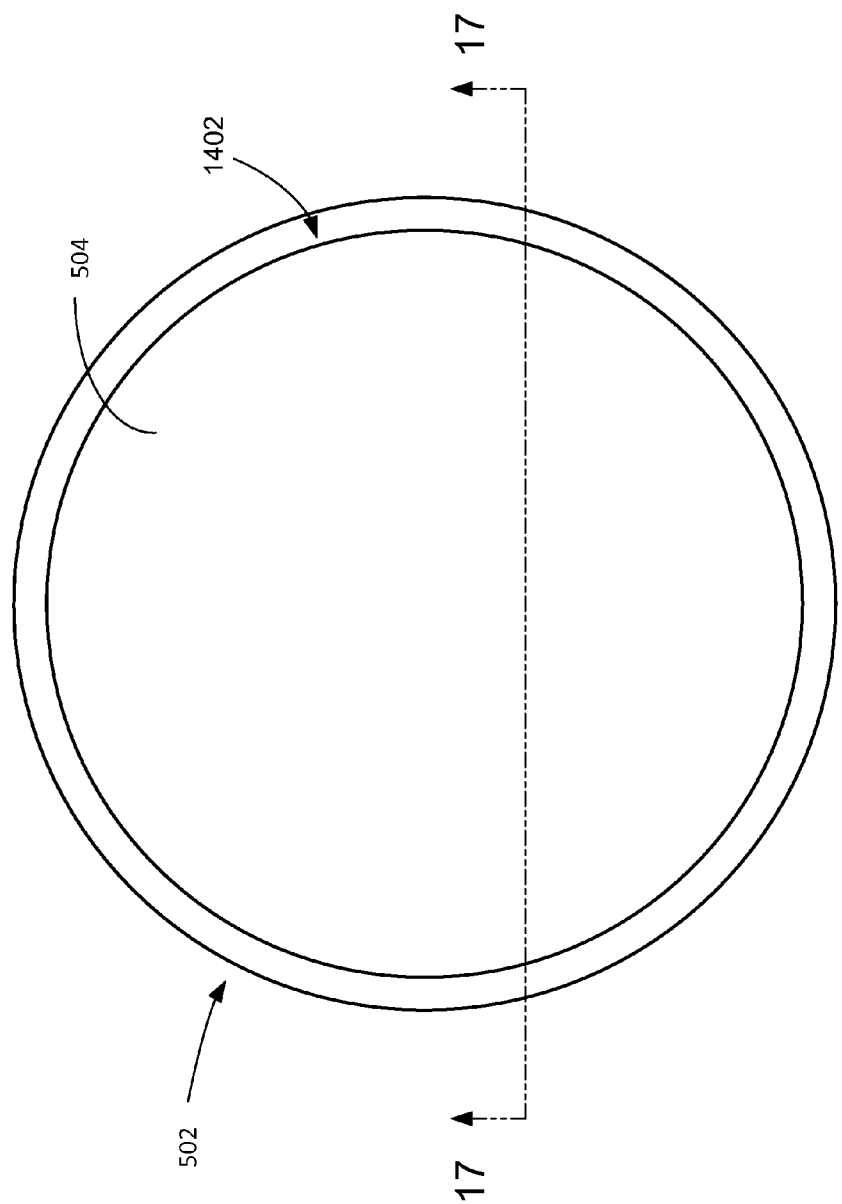
FIG. 16 is a top view of the structure of FIG. 14 on the structure of FIG. 5 in a mounting phase.

Referring now to FIG. 16, therein is shown a top view of the structure of FIG. 14 on the structure of FIG. 5 in a mounting phase. The top view depicts the wafer frame 1402 of FIG. 14 mounted over the semiconductor wafer 502 having the semiconductor active side 504 exposed around a circumference of the wafer frame 1402 during a mounting process. The mounting process can include mechanized fixtures (not show) that can include automated computer monitoring, alignment, and positional equipment in a clean room environment.

Figure 17:
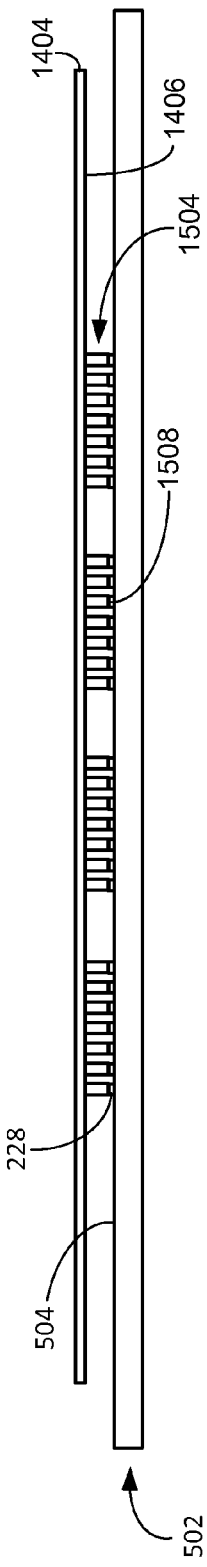
FIG. 17 is a cross-sectional view of FIG. 16 taken along a line 17-17 of FIG. 16 in an attaching phase.

Referring now to FIG. 17, therein is shown a cross-sectional view of FIG. 16 taken along a line 17-17 of FIG. 16 in an attaching phase. Each of the connect sites 1408 of FIG. 14 on the connection side 1406 of the horizontal cover 1404 are aligned over the chip sites 506 of FIG. 5 on the semiconductor active side 504 of the semiconductor wafer 502.

The chip pads 228 of the semiconductor wafer 502 are attached to the attachment surfaces 1508 of the protruding connectors 1504 using a conductive bonding material during an attaching process. The conductive bonding material can include a eutectic reaction layer with thermo-compression, ultra-sonic, thermo-sonic, thermo conductive applied energy.

Figure 18:
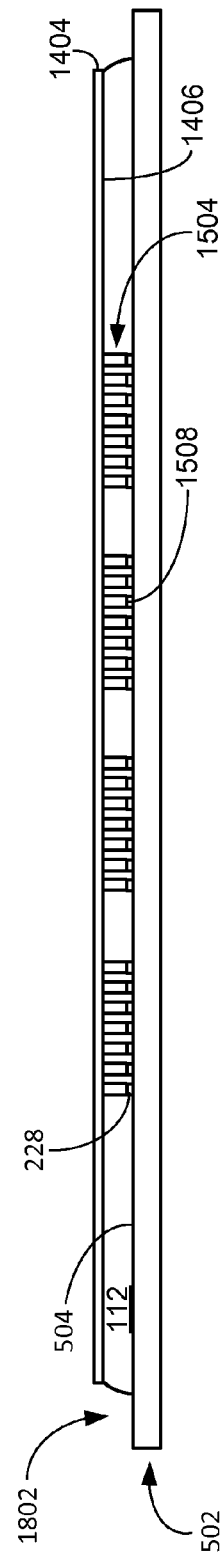
FIG. 18 is the structure of FIG. 17 in an underfill applying phase.

Referring now to FIG. 18, therein is shown the structure of FIG. 17 in an underfill applying phase. The underfill 112 is applied between the horizontal cover 1404 and the semiconductor wafer 502 using a filling process that can include a combination of dispensing equipment (not shown) with contact heating, convective heating, or infrared heating.

The underfill 112 surrounds the protruding connectors 1504, surrounds the chip pads 228, and covers the connection side 1406 and an area of the semiconductor active side 504 facing the connection side 1406. A ring shaped area 1802 around the underfill 112 can expose the semiconductor active side 504 between the underfill 112 and a perimeter outline of the semiconductor wafer 502.

Referring now to FIG. 19, therein is shown the structure of FIG. 18 in an etching phase. The horizontal cover 1404 of FIG. 18 is removed from above the chip sites 506 to expose the end of each of the protruding connectors 1504 of FIG. 18 opposite the end with the attachment surfaces 1508 using an etching process.

The etching process can form the first post ends 102, the second post ends 104 of FIG. 2, the third post ends 106 of FIG. 2, and the fourth post ends 108 of FIG. 2 from the protruding connectors 804. Only the first post ends 102 are depicted in the figure. The first post ends 102, the second post ends 104, the third post ends 106, and the fourth post ends 108 are exposed from the underfill 112.

The first post ends 102 are parallel to the semiconductor wafer 502. The first post ends 102, the second post ends 104, the third post ends 106, and the fourth post ends 108 are formed having the etch marks.

Referring now to FIG. 20, therein is shown the structure of FIG. 19 in a singulation phase. Non-horizontal planar cuts through the semiconductor wafer 502 and the underfill 112 are used to separate the chip sites 506 of FIG. 19 from one another and the ring shaped area 1802 during a singulation process. The singulation process includes cutting, sawing, grinding, or any combination thereof.

Each of the chip sites 506 isolated from the structure of FIG. 19 results in the formation of an integrated circuit package 2002. The integrated circuit package 2002 can be identical to the integrated circuit packaging system 100 of FIG. 2 and include the integrated circuit chip 222, the first conductive posts 202, the second conductive posts 204 of FIG. 2, the third conductive posts 206 of FIG. 2, and the fourth conductive posts 208. The underfill 112, and the chip pads 228. The non-horizontal underfill sides 114, the non-horizontal sides 230, and the attachment side 210 are formed during the singulation process.

Figure 21:
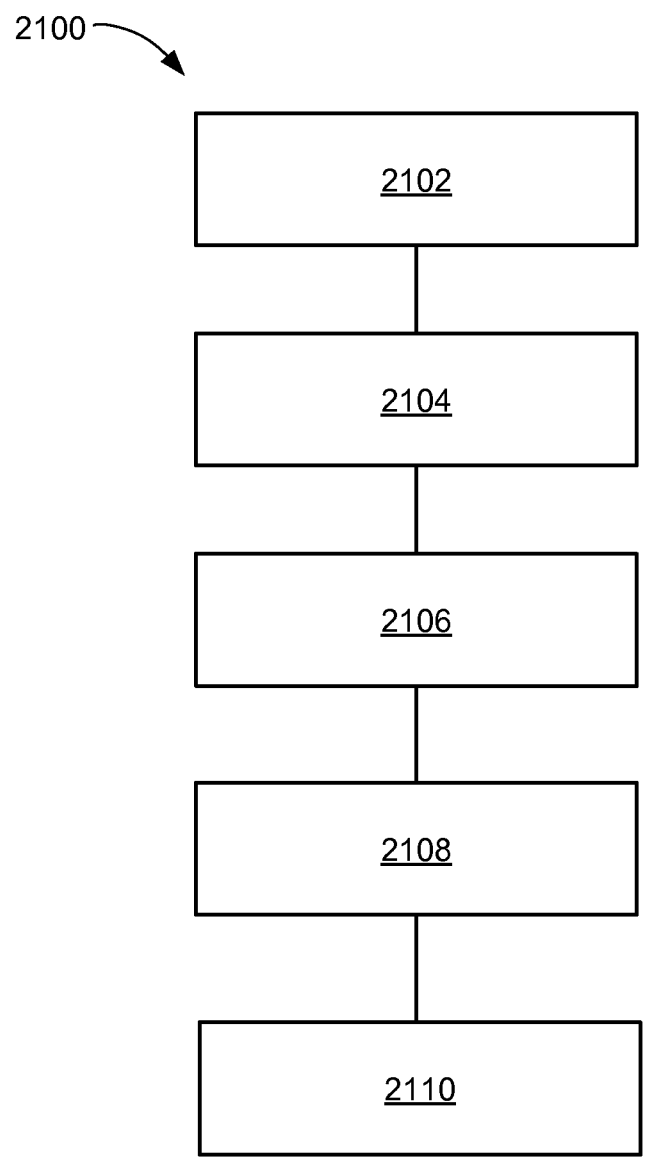
FIG. 21 is a flow chart of a method of manufacture of the integrated circuit packaging system in a further embodiment of the present invention.

Referring now to FIG. 21, therein is shown is a flow chart of a method 2100 of manufacture of the integrated circuit packaging system 100 in a further embodiment of the present invention. The method 2100 includes: providing a semiconductor wafer having a chip pad in a block 2102; attaching a wafer frame to the semiconductor wafer, the wafer frame having a horizontal cover integral to a protruding connector with the protruding connector on the chip pad in a block 2104; forming an underfill around the protruding connector and between the horizontal cover and the semiconductor wafer in a block 2106; removing the horizontal cover exposing the underfill and the protruding connector in a block 2108; and singulating an integrated circuit package from the semiconductor wafer in a block 2110.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package comprising:
   providing a semiconductor wafer having a chip pad formed thereon, an active side of the semiconductor wafer is in direct contact with a top side of the chip pad and the chip pad includes a lateral sidewall exposed from the semiconductor wafer;
   providing a wafer frame having a protruding connector formed thereon and extending therefrom;
   attaching the wafer frame to the semiconductor wafer with a bonding material such that the protruding connector contacts the chip pad;
   forming an underfill between the wafer frame and the semiconductor wafer such that the underfill forms around the protruding connector, wherein forming the underfill includes forming the underfill in direct contact with the lateral sidewall of the chip pad; and
   removing the wafer frame exposing the underfill and the protruding connector, wherein the underfill and the protruding connector are substantially planar.

2. The method of claim 1, further comprising:
   singulating the semiconductor wafer to form an integrated circuit package having the chip pad and the protruding connector.

3. The method of claim 1, wherein providing the semiconductor wafer includes providing the semiconductor wafer having a non-active side, and wherein the chip pad is formed on the active side of the semiconductor wafer.

4. The method of claim 1, wherein providing the wafer frame includes providing the wafer frame having a horizontal cover, and wherein the protruding connector is formed on the horizontal cover and extending therefrom.

5. The method of claim 1, wherein removing the wafer frame includes planarizing the wafer frame by a grinding process.

6. The method of claim 1, wherein removing the wafer frame includes etching the wafer frame with an etching process.

7. A method of manufacturing an integrated circuit package comprising:
   providing a semiconductor wafer having a chip pad formed thereon, an active side of the semiconductor wafer is in direct physical contact with a top side of the chi ad and the chip pad includes a lateral sidewall exposed from the semiconductor wafer;
   providing a wafer frame having a protect layer and a protruding connector formed thereon, the protect layer between the wafer frame and the protruding connector;

attaching the wafer frame to the semiconductor wafer with a bonding material such that the protruding connector contacts the chip pad;

forming an underfill between the wafer frame and the semiconductor wafer such that the underfill forms around the protect layer, the protruding connector, and wherein forming the underfill includes forming the underfill in direct contact with the lateral sidewall of the chip pad; and removing the wafer frame exposing the underfill and the protect layer, wherein the underfill and the protect layer are substantially planar.

8. The method of claim 7, further comprising:

singulating the semiconductor wafer to form an integrated circuit package having the chip pad, the protect layer, and the protruding connector.

9. The method of claim 7, wherein providing the semiconductor wafer includes providing the semiconductor wafer having a non-active side, and wherein the chip pad is formed on the active side of the semiconductor wafer.

10. The method of claim 7, wherein providing the wafer frame includes providing the wafer frame having a horizontal cover, and wherein the protruding connector is formed on the horizontal cover and extending therefrom.

11. The method of claim 7, wherein removing the wafer frame includes planarizing the wafer frame by a grinding process.

12. The method of claim 7, wherein removing the wafer frame includes etching the wafer frame with an etching process.

13. A method of manufacturing an integrated circuit package comprising:

providing a semiconductor wafer having a chip pad formed thereon, an active side of the semiconductor wafer is in direct physical contact with a top side of the chip pad and the chip pad includes a lateral sidewall exposed from the semiconductor wafer;

providing a wafer frame having a horizontal cover, wherein a protruding connector is formed on the horizontal cover and extending therefrom;

attaching the horizontal cover to the semiconductor wafer with a bonding material such that the protruding connector contacts the chip pad;

forming an underfill between the horizontal cover and the semiconductor wafer such that the underfill forms around the protruding connector, and wherein forming the underfill includes forming the underfill in direct contact with the lateral sidewall of the chip pad; and removing the horizontal cover exposing the underfill and the protruding connector, wherein the underfill and the protruding connector are substantially planar.

14. The method of claim 13, further comprising:

singulating the semiconductor wafer to form an integrated circuit package having the chip pad and the protruding connector.

15. The method of claim 13, wherein providing the semiconductor wafer includes providing the semiconductor wafer having a non-active side, and wherein the chip pad is formed on the active side of the semiconductor wafer.

16. The method of claim 13, wherein removing the horizontal cover includes completely planarizing the horizontal cover by a grinding process.

17. The method of claim 13, wherein removing the horizontal cover includes completely etching the horizontal cover with an etching process.

18. The method of claim 13, wherein providing the wafer frame includes providing the wafer frame having the horizontal cover, wherein the horizontal cover is formed of a first material, and wherein the protruding connector formed on the horizontal cover is formed of a second material, the second material different from the first material.

19. The method of claim 18, wherein removing the horizontal cover includes planarizing the first material without planarizing the second material.

20. The method of claim 18, wherein removing the horizontal cover includes etching the first material without etching the second material.

* * * * *

UNITED STATES PATENT AND TRADEMARK OFFICE
CERTIFICATE OF CORRECTION

PATENT NO.        : 9,082,887 B1                          Page 1 of 1
APPLICATION NO.   : 13/966259
DATED             : July 14, 2015
INVENTOR(S)       : Choi et al.

It is certified that error appears in the above-identified patent and that said Letters Patent is hereby corrected as shown below:

In the Claims:

Column 14, Claim 7, line 63, delete "chi ad" and insert therefor --chip pad--

Signed and Sealed this
Twenty-ninth Day of March, 2016

Michelle K. Lee
*Director of the United States Patent and Trademark Office*